United States Patent [19]
Bearden et al.

[11] Patent Number: 5,565,386
[45] Date of Patent: Oct. 15, 1996

[54] METHOD OF CONNECTING TO INTEGRATED CIRCUITRY

[75] Inventors: David R. Bearden, Austin; Mark D. Bolliger, Round Rock, both of Tex.

[73] Assignees: International Business Machines Corporation, Armonk, N.Y.; Motorola, Inc., Schaumburg, Ill.

[21] Appl. No.: 478,160

[22] Filed: Jun. 7, 1995

Related U.S. Application Data

[62] Division of Ser. No. 323,202, Oct. 14, 1994, abandoned.

[51] Int. Cl.⁶ ................................................ H01L 21/60
[52] U.S. Cl. ........................ 437/209; 437/180; 437/211; 437/214
[58] Field of Search ................................. 437/209, 211, 437/214, 215, 180, 182, 183

[56] References Cited

U.S. PATENT DOCUMENTS 4,623,911  11/1986  Pryor ........................ 257/202

*Primary Examiner*—Kevin M. Picardat
*Attorney, Agent, or Firm*—Michael A. Davis, Jr.

[57] ABSTRACT

A method and structure are provided for connecting to integrated circuitry. A connectivity cell includes multiple terminals formed within the integrated circuitry. The connectivity cell further includes at least one metal layer connected to at least one of the terminals. A first area is a substantially minimal area including the connectivity cell. A second area is a substantially minimal area including at least a part of each of multiple portions of the integrated circuitry. The portions are connectable to respective ones of the terminals while having a placement flexibility relative to the terminals. This placement flexibility of the portions is substantially equal to a placement flexibility of the second area within the first area.

13 Claims, 5 Drawing Sheets

METHOD OF CONNECTING TO INTEGRATED CIRCUITRY

CROSS-REFERENCES TO RELATED APPLICATIONS

This patent application is a divisional of U.S. patent application Ser. No. 08/323,202, filed Oct. 14, 1994, now abandoned, and is related to copending coassigned U.S. patent application Ser. No. 08/558,859, entitled Structure for Connecting to Integrated Circuitry, by D. R. Bearden et al., filed Nov. 15, 1995, which is a continuation of application Ser. No. 08/323,202.

TECHNICAL FIELD

This patent application relates in general to integrated circuitry and in particular to a method and structure for connecting to integrated circuitry.

BACKGROUND OF THE INVENTION

Typically, integrated circuitry is interfaced to other circuitry through input and output receivers and drivers ("IORDs"), which are logic portions of the integrated circuitry. The IORDs are respectively connected to other logic portions (e.g. registers, multiplexers, arrays). Moreover, the IORDs are respectively connected to terminal pads ("terminals") of the integrated circuitry. These terminal pads are connected to a package in which the integrated circuitry is encapsulated. More particularly, the terminal pads include a top level metal layer connected to the package.

Commonly, designs of the integrated circuitry and of the package are done largely in parallel. More particularly, the designs are done after defining interfaces between the integrated circuitry and the package, yet before completion of either design. Connections between the integrated circuitry and the package are finalized before completion of either design.

In order to avoid greatly constraining the locations of the IORDs' respectively connected logic portions within the integrated circuitry, conventionally the IORDs are positioned on the periphery of the integrated circuitry. Accordingly, the integrated circuitry is designed so that a necessary border is reserved around its periphery for the IORDs. In this manner, connections between the integrated circuitry and the package are more readily finalized before completion of either design, while allowing designs of the integrated circuitry and of the package to be done largely in parallel.

Nevertheless, such previous techniques have shortcomings. For example, by positioning the IORDs on the periphery of the integrated circuitry, the IORDs are frequently more physically remote from their respectively connected logic portions within the integrated circuitry. Moreover, more silicon area can be used, and less efficient use is made of metal layers, in order to position the IORDs on the periphery of the integrated circuitry. Also, performance of the integrated circuitry can be degraded by positioning the IORDs on the periphery of the integrated circuitry.

Thus, a need has arisen for a method and structure for connecting to integrated circuitry, in which IORDs are not necessarily positioned on the periphery of the integrated circuitry. Also, a need has arisen for a method and structure for connecting to integrated circuitry, in which IORDs are more physically proximate to their respectively connected logic portions within the integrated circuitry, relative to previous techniques. Further, a need has arisen for a method and structure for connecting to integrated circuitry, in which less silicon area is used, and more efficient use is made of metal layers, in order to locate the IORDs on the integrated circuitry, relative to previous techniques. Moreover, a need has arisen for a method and structure for connecting to integrated circuitry, in which performance of the integrated circuitry is improved relative to previous techniques. Yet another need has arisen for a method and structure for connecting to integrated circuitry, in which portions of the integrated circuitry have a greater placement flexibility relative to previous techniques, even after interfaces are defined between the integrated circuitry and the package.

SUMMARY OF THE INVENTION

In a method and structure for connecting to integrated circuitry, a connectivity cell includes multiple terminals formed within the integrated circuitry. The connectivity cell further includes at least one metal layer connected to at least one of the terminals. A first area is a substantially minimal area including the connectivity cell. A second area is a substantially minimal area including at least a part of each of multiple portions of the integrated circuitry. The portions are connectable to respective ones of the terminals while having a placement flexibility relative to the terminals. This placement flexibility of the portions is substantially equal to a placement flexibility of the second area within the first area.

It is a technical advantage of the present invention that IORDs are not necessarily positioned on the periphery of the integrated circuitry.

It is another technical advantage of the present invention that IORDs are more physically proximate to their respectively connected logic portions within the integrated circuitry, relative to previous techniques.

It is a further technical advantage of the present invention that less silicon area is used, and more efficient use is made of metal layers, in order to locate the IORDs on the integrated circuitry, relative to previous techniques.

It is yet another technical advantage of the present invention that performance of the integrated circuitry is improved relative to previous techniques.

It is yet a further technical advantage of the present invention that portions of the integrated circuitry have a greater placement flexibility relative to previous techniques, even after interfaces are defined between the integrated circuitry and the package.

BRIEF DESCRIPTION OF THE DRAWINGS

An illustrative embodiment of the present inventions and their advantages are better understood by referring to the following descriptions and accompanying drawings, in which.

DETAILED DESCRIPTION

An illustrative embodiment of the present inventions and their advantages are better understood by referring to FIGS. 1–6 of the drawings, like numerals being used for like and corresponding parts of the accompanying drawings.

Figure 1:
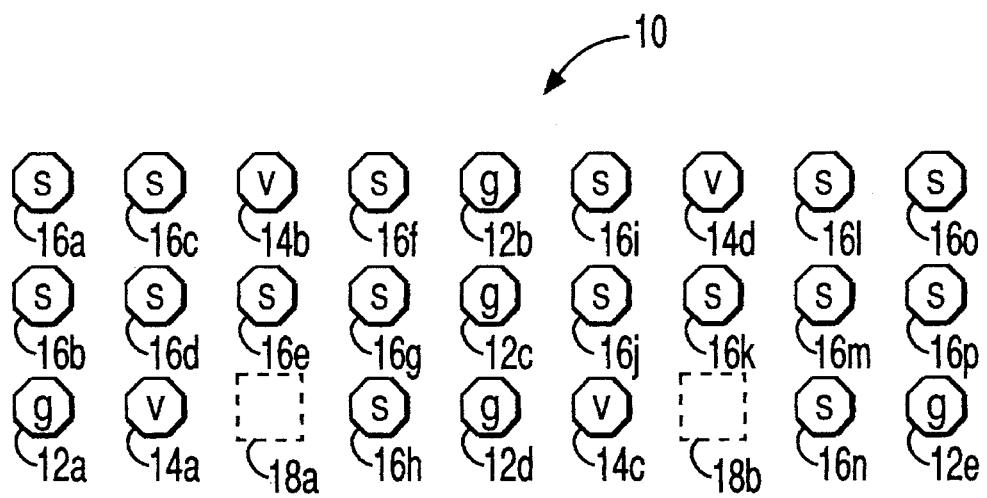
FIG. 1 is an illustration of a terminal pad group according to the illustrative embodiment.

FIG. 1 is an illustration of a terminal pad group, indicated generally at 10, according to the illustrative embodiment. Terminal pad group 10 includes dedicated ground terminal pads 12a–e, dedicated Vdd terminal pads 14a–d, and dedicated signal terminal pads 16a–p. Terminal pads 12a–e, 14a–d, and 16a–p are located within integrated circuitry (not shown in FIG. 1). Each of terminal pads 16a–p is connected to respective input/output ("I/O") receiver/driver ("IORD") circuitry of the integrated circuitry. Unless otherwise indicated, all connections shown in FIGS. 1–6 and discussed herein are electrical connections.

In a significant aspect of the illustrative embodiment, the arrangement of terminal pads 12a–e, 14a–d, and 16a–p is a repeatable 9×3 (m×n) array. Regions, indicated by dashed enclosures 18a and 18b, operate as place holders for integrated circuitry Vdd. In the illustrative embodiment, the repeatable terminal pad arrangement is designed in consideration of the following factors: (a) bounding box size of the integrated circuitry IORD group, (b) size and form factor of the window in which the integrated circuitry IORD group is located, (c) the integrated circuitry floor plan and functionality data flow, and (d) horizontal and vertical stepping size and design rule requirements of the integrated circuitry terminal pads.

Figure 2:
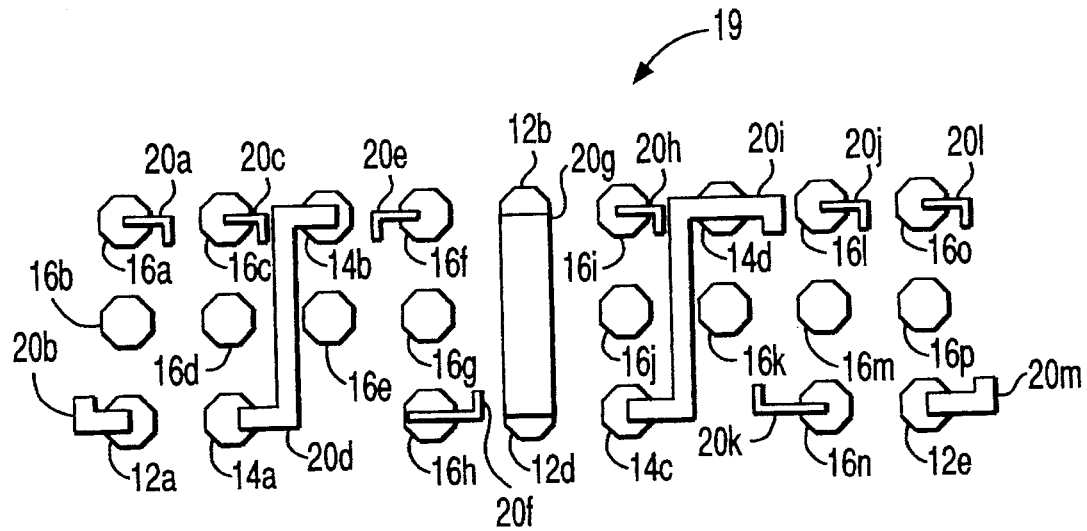
FIG. 2 is an illustration of a primary connectivity cell according to the illustrative embodiment.

FIG. 2 is an illustration of a primary connectivity cell, indicated generally at 19, according to the illustrative embodiment. FIG. 2 shows a top level metal layer connected to specified terminal pads of terminal pad group 10. More particularly, FIG. 2 shows the top level metal layer patterned to form metal layers 20a–m, which are connected to specified ones of terminal pads 12a–e, 14a–d, and 16a–p. Metal layers 20a–m are positioned, oriented, and shaped relative to terminal pad group 10 substantially as shown in FIG. 2. Together, metal layers 20a–m and terminal pads 12a–e, 14a–d, and 16a–p form primary connectivity cell 19 according to the illustrative embodiment.

As shown in FIG. 2, metal layer 20a is connected to terminal pad 16a, metal layer 20b is connected to terminal pad 12a, and metal layer 20c is connected to terminal pad 16c. Further, Vdd terminal pads 14a and 14b are connected to one another through metal layer 20d. Likewise, Vdd terminal pads 14c and 14d are connected to one another through metal layer 20i.

Ground terminal pads 12b, 12c and 12d are connected to one another through metal layer 20g. Moreover, metal layer 20e is connected to terminal pad 16f, metal layer 20f is connected to terminal pad 16h, and metal layer 20h is connected to terminal pad 16i. Also, metal layer 20j is connected to terminal pad 16l, metal layer 20k is connected to terminal pad 16n, and metal layer 20l is connected to terminal pad 16o. Metal layer 20m is connected to terminal pad 12e.

Figure 3A:
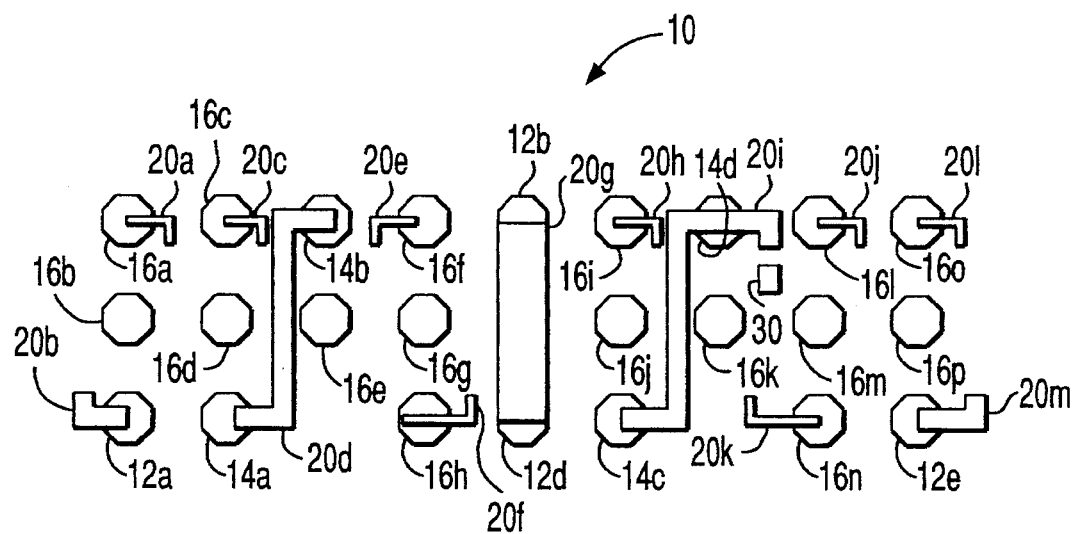
FIGS. 3a–c are illustrations of example modifications to the top level metal layer of FIG. 2.
Figure 3B:
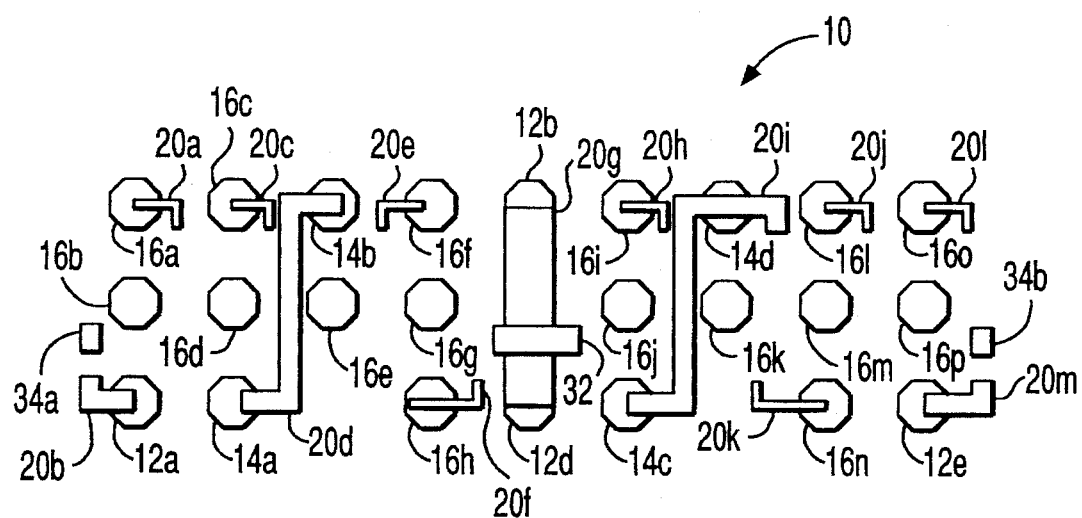
Figure 3C:
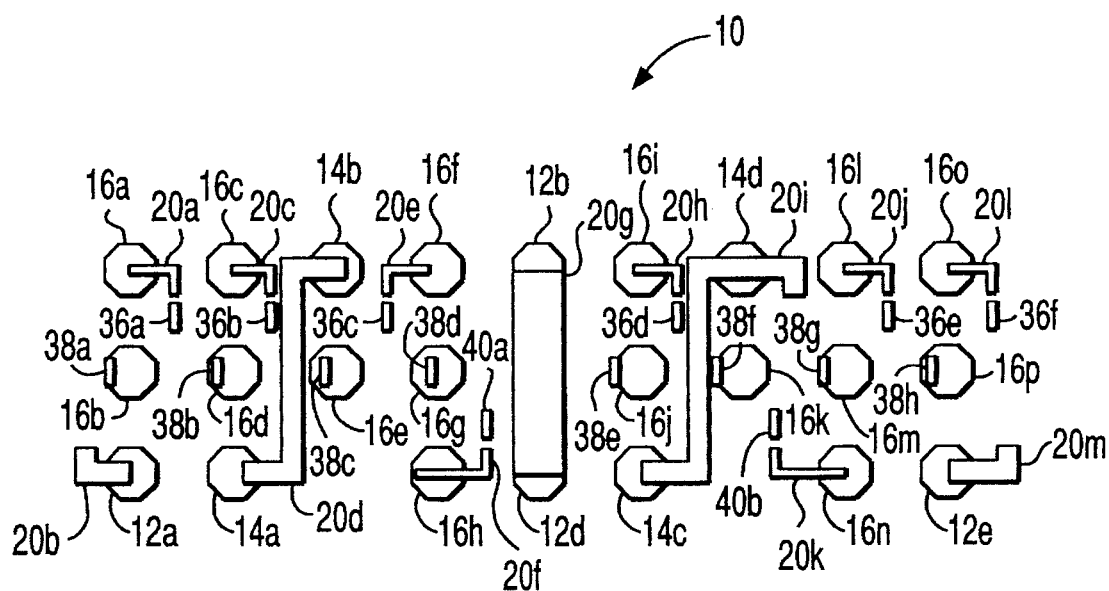

FIGS. 3a–c are illustrations of example modifications to the top level metal layer (and hence to the primary connectivity cell 19) of FIG. 2. In alternative embodiments, the standard primary connectivity cell 19 of FIG. 2 is permanently redefined to incorporate all or some of the example modifications shown in FIGS. 3a–c and in FIG. 5 discussed further hereinbelow.

In FIG. 3a, a Vdd extension metal layer 30 is connected to metal layer 20i. Vdd extension metal layer 30 is positioned, oriented, and shaped relative to terminal pad group 10 substantially as shown in FIG. 3a. The modified connectivity cell of FIG. 3a is suitable for connecting a dedicated power supply bus of the integrated circuitry to Vdd terminal pads 14c and 14d.

For clarity, in FIG. 3a, the actual connection between Vdd extension metal layer 30 and metal layer 20i is not shown. Nevertheless, in the example of FIG. 3a, the top level metal layer (discussed further hereinabove in connection with FIG. 2) is patterned so that Vdd extension metal layer 30 is formed integrally with metal layer 20i.

Likewise, for clarity, in FIGS. 3b–c, actual connections between extension metal layers and other metal layers are not shown. In FIGS. 3b–c, where a connection is discussed between an extension metal layer and a particular metal layer, the top level metal layer (discussed further hereinabove in connection with FIG. 2) is patterned so that the extension metal layer is formed integrally with the particular metal layer. All extension metal layers are positioned, oriented, and shaped relative to terminal pad group 10 substantially as shown in FIGS. 3b–c.

Referring to FIG. 3b, an inner ground extension metal layer 32 is connected to metal layer 20g. Also, in FIG. 3b, outer ground extension metal layers 34a and 34b are connected to metal layers 20b and 20m, respectively. Either with extension metal layer 32 or with extension metal layers 34a–b, the modified connectivity cell of FIG. 3b is suitable for connecting a dedicated ground supply bus of the integrated circuitry to ground terminal pads 12a–e.

Referring to FIG. 3c, upper signal extension metal layers 36a, 36b, and 36c are connected to metal layers 20a, 20c, and 20e, respectively. Also, upper signal extension metal layers 36d, 36e, and 36f are connected to metal layers 20h, 20j, and 20l, respectively. Further, middle signal extension metal layers 38a–h are respectively positioned over signal terminal pads 16b, 16d, 16e, 16g, 16j, 16k, 16m and 16p substantially as shown in FIG. 3c. Moreover, lower signal extension metal layers 40a and 40b are connected to metal layers 20f and 20k, respectively. Either with extension metal layers 36a–f, with extension metal layers 38a–h, or with extension metal layers 40a–b, the modified connectivity cell of FIG. 3c is suitable for connecting IORD signals to signal terminal pads 16a–p.

In the illustrative embodiment, IORDs are positioned physically proximate to their respectively connected logic portions within integrated circuitry. Accordingly, in many cases, the IORDs are positioned physically proximate to the center of the integrated circuitry. In this manner, integrated circuitry according to the illustrative embodiment can be implemented with less silicon area and more efficiently used metal layers, relative to previous techniques. Also, performance of the integrated circuitry can be improved by positioning the IORDs physically proximate to their respectively connected logic portions within the integrated circuitry.

In the illustrative embodiment, designs of the integrated circuitry and of the package are done largely in parallel. More particularly, the designs are done after defining interfaces between the integrated circuitry and the package, yet before completion of either design. Connections between the integrated circuitry and the package are finalized before completion of either design.

Advantageously, in the illustrative embodiment, locations of terminal pads 12a–e, 14a–d, and 16a–p are definable prior to completing designs of the integrated circuitry and of the package. Moreover, in a significant aspect of the illustrative embodiment, even though some IORDs can be positioned physically proximate to the center of the integrated circuitry, the locations of such IORDs' respectively connected logic portions (within the integrated circuitry) are not greatly constrained during design of the integrated circuitry. More particularly, the illustrative embodiment uses a deterministic connectivity technique for connecting the IORDs to their respective terminal pads. Significantly, this deterministic connectivity technique achieves the goal of providing flexibility for designing and positioning the IORDs and surrounding components within the integrated circuitry, even after locations of terminal pads 12a–e, 14a–d, and 16a–p are defined.

Figure 4:
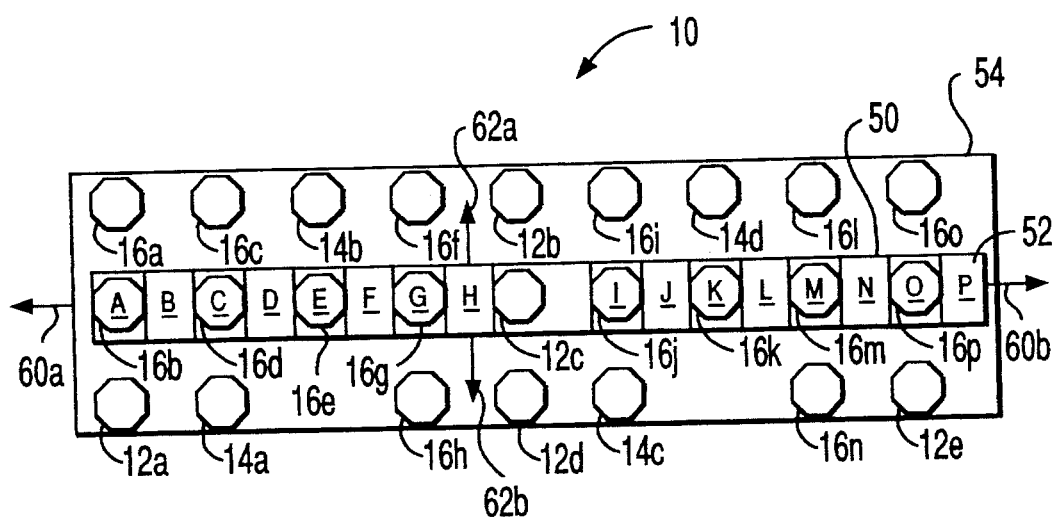
FIG. 4 is an illustration of a terminal pad group bounding box according to the illustrative embodiment.

FIG. 4 is an illustration of a bounding box 50 according to the illustrative embodiment. Bounding box 50 delineates horizontal and vertical placement boundaries for an IORD group 52 including sixteen regions A, B, C, D, E, F, G, H, I, J, K, L, M, N, O and P. More particularly, bounding box 50 is a substantially minimal area which is defined to include at least a part of each of regions A–P. Each of IORD regions A–P includes a respective IORD within the integrated circuitry.

A window 54 delineates horizontal and vertical placement boundaries for the combination of terminal pad group 10 and metal layers 20a–m (FIG. 2). More particularly, window 54 is a substantially minimal area which is defined to fully include the entire primary connectivity cell 19 of FIG. 2. Bounding box 50 is smaller than window 54, so that IORD group 52 is positionable anywhere within window 54.

In the illustrative embodiment, bounding box 50 has a size of 2267.1 microns by 199.8 microns. By comparison, window 54 has a size of 2277.5 microns by 500.0 microns. Accordingly, in the illustrative embodiment, IORD group 52 has a horizontal placement flexibility (in the directions of arrows 60a and 60b) of 10.4 microns and a vertical placement flexibility (in the directions of arrows 62a and 62b) of 300.2 microns. For terminal pad group 10, the horizontal placement is variable according to nonscalability between IORDs in regions A–P and the terminal pad sizes and periodicity. The greatest placement flexibility is in the vertical directions of arrows 62a and 62b, due to the implementation, design and placement of the integrated circuitry floor plan components and IORDs.

According to the deterministic connectivity technique of the preferred embodiment, each of the sixteen IORDs in regions A–P is connectable to its respective one of terminal pads 16a–p through metal layers (including suitable extension metal layers), irrespective of the actual horizontal and vertical placement position of IORD group 52 within window 54. More particularly, in response to the position of IORD group 52 within window 54, extension metal layers (discussed further hereinabove in connection with FIGS. 3a–c) are formed in an algorithmic manner in order to modify the primary connectivity cell 19 of FIG. 2 so that the IORDs in regions A–P are connected to associated ones of terminal pads 16a–p.

The IORDs in regions A–P are connectable to associated ones of terminal pads 16a–p while having a placement (or positional) flexibility relative to terminal pads 16a–p. This placement flexibility of regions A–P (and hence of the IORDs in regions A–P) is substantially equal to a placement flexibility of bounding box 50 within window 54. Moreover, regions A–P (and hence each of the IORDs in regions A–P) have such placement flexibility independent of one another.

Accordingly, signal terminal pad 16a is connected to IORD circuitry in region B, and signal terminal pad 16b is connected to IORD circuitry in region A. Likewise, signal terminal pad 16c is connected to IORD circuitry in region D, and signal terminal pad 16d is connected to IORD circuitry in region C. Also, signal terminal pad 16e is connected to IORD circuitry in region E.

Further, signal terminal pad 16f is connected to IORD circuitry in region F, and signal terminal pad 16g is connected to IORD circuitry in region G. Moreover, signal terminal pad 16h is connected to IORD circuitry in region H, and signal terminal pad 16i is connected to IORD circuitry in region J. Also, signal terminal pad 16j is connected to IORD circuitry in region I, and signal terminal pad 16k is connected to IORD circuitry in region K.

Similarly, signal terminal pad 16l is connected to IORD circuitry in region N. Signal terminal pad 16m is connected to IORD circuitry in region M, and signal terminal pad 16n is connected to IORD circuitry in region L. Finally, signal terminal pad 16o is connected to IORD circuitry in region P, and signal terminal pad 16p is connected to IORD circuitry in region O.

Each of terminal pads 16a–p is further connected to a respective pin connector of a package (not shown in FIG. 2) in which the integrated circuitry is encapsulated. The integrated circuitry is interfaced to other circuitry through such pin connectors. Accordingly, the sixteen IORDs in regions A–P of the integrated circuitry are coupled through metal layers 20a–m (and suitable extension metal layers) and further through terminal pads 16a–p to sixteen pin connectors of the package.

Figure 5:
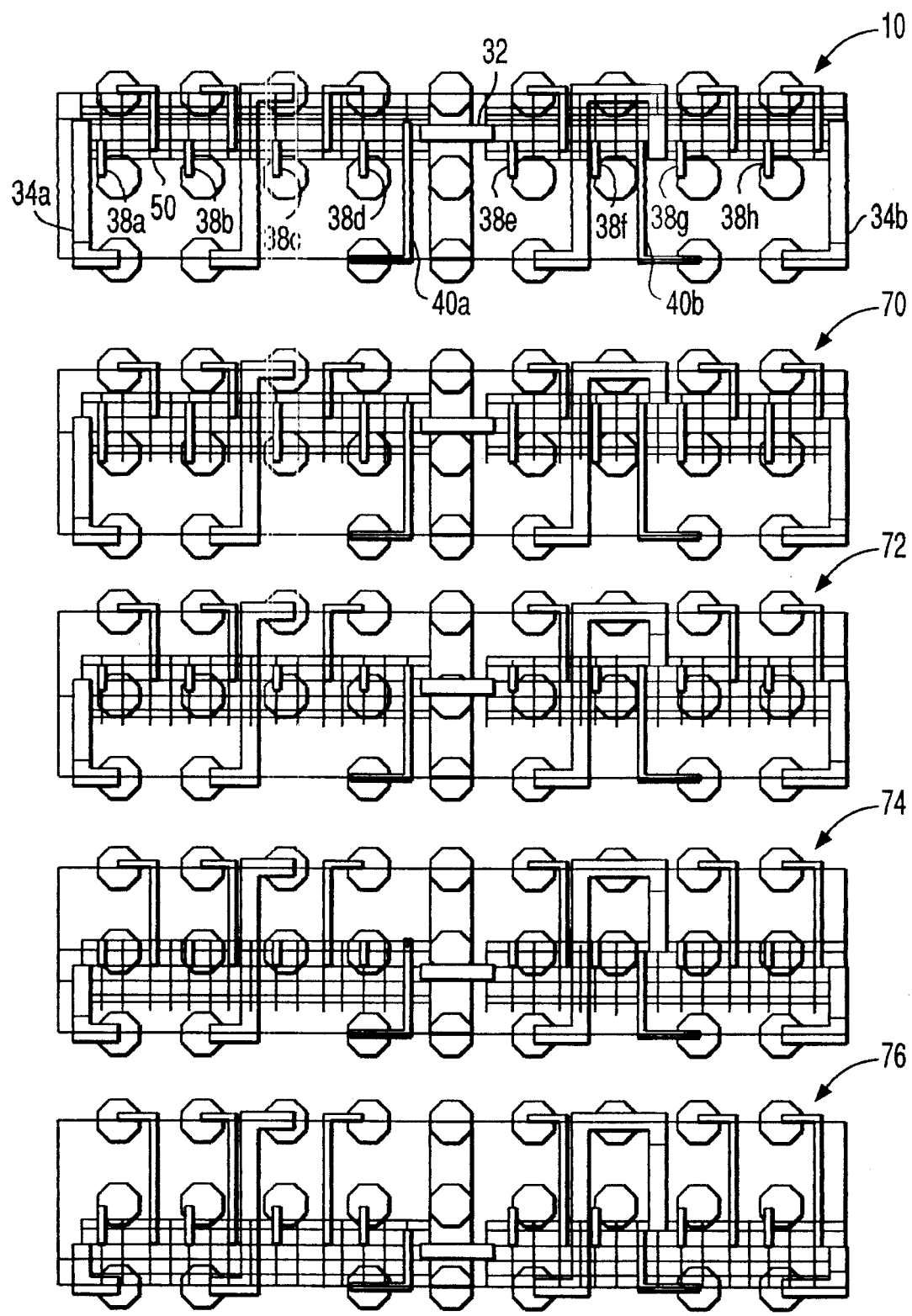
FIG. 5 is an illustration of placement flexibility of portions of integrated circuitry within multiple substantially identical terminal pad groups according to the illustrative embodiment.

FIG. 5 is an illustration of placement flexibility of portions of integrated circuitry within multiple substantially identical terminal pad groups 10, 70, 72, 74 and 76, according to the illustrative embodiment. As shown in FIG. 5, bounding box 50 is positioned toward the upper portion of window 54.

Accordingly, lower signal extension metal layers 40a and 40b are formed in order to modify the primary connectivity cell 19 of FIG. 2 so that the IORDs in regions H and L are connected to terminal pads 16h and 16n, respectively. Also, middle signal extension metal layers 38a–h are formed in order to modify the primary connectivity cell 19 of FIG. 2 so that the IORDs in regions A, C, E, G, I, K, M and O are connected to terminal pads 16b, 16d, 16e, 16g, 16j, 16k, 16m and 16p, respectively. Further, in this example, ground extension metal layers 32 and 34a–b are formed as shown in FIG. 5 so that a dedicated ground supply bus of the integrated circuitry is connected to ground terminal pads 12a–e.

Referring to terminal pad group 70, its IORD group is positioned toward the upper middle portion of its group's window. By comparison, the IORD group of terminal pad group 72 is positioned toward the middle portion of its window. Moreover, the IORD group of terminal pad group 74 is positioned toward the lower middle portion of its window. Also, the IORD group of terminal pad group 76 is positioned toward the lower portion of its window.

Accordingly, each IORD group is positionable within its respective window, independent of other IORD groups' respective positions within their windows. Similarly, although not illustrated in FIG. 5, regions A–P (and hence each of the IORDs in regions A–P) have such placement (or positioning) flexibility independent of one another. For example, region A of terminal pad group 10 can be positioned toward the upper portion of its group's window 54, even if simultaneously region B of terminal pad group 10 is positioned toward the lower portion of its group's window 54. This capability is apparent from FIGS. 2–4. Thus, in the illustrative embodiment, respective positions (or placements) in the directions of arrows 62a–b of regions A–P within window 54 are fully independent of one another.

As shown in FIG. 5, for each IORD group, signal extension metal layers are suitably formed in order to modify the primary connectivity cell 19 of FIG. 2 so that IORD signals are connected to signal terminal pads. Moreover, ground extension metal layers are suitably formed as shown in FIG. 5 so that a dedicated ground supply bus of the integrated circuitry is connected to ground terminal pads. Similarly, Vdd extension metal layers are suitably formed as shown in FIG. 5 so that a dedicated power supply bus of the integrated circuitry is connected to Vdd terminal pads. In this example, extension metal layers are positioned, oriented, and shaped relative to terminal pad groups substantially as shown in FIG. 5.

Figure 6:
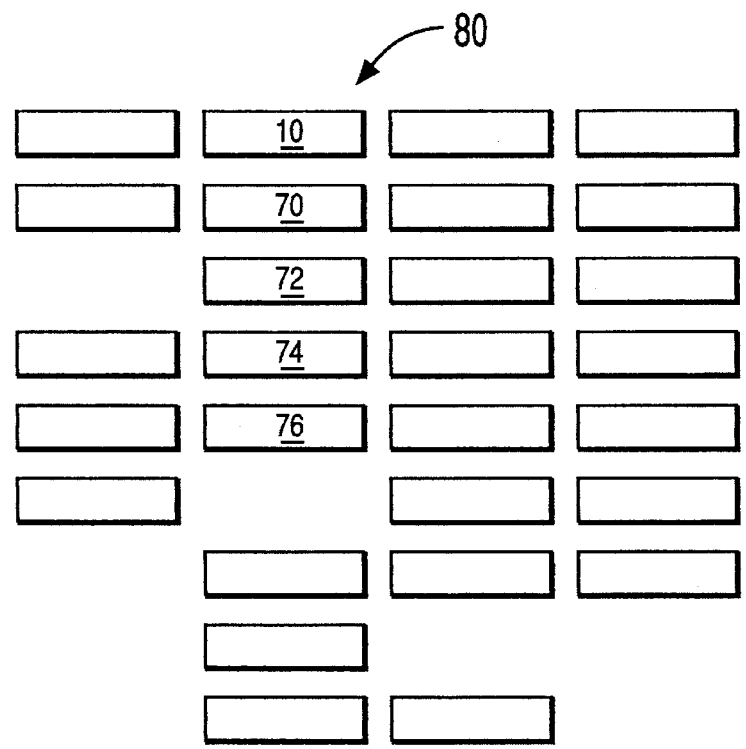
FIG. 6 is an illustration of an array of multiple terminal pad groups within integrated circuitry according to the illustrative embodiment.

FIG. 6 is an illustration of an array of multiple terminal pad groups within integrated circuitry, indicated generally at 80, according to the illustrative embodiment. In the example of FIG. 6, the terminal pad groups are duplicated within a 4×9 (m×n) array. The array includes eight empty slots, resulting primarily from (a) floor plan implementation of functional units within integrated circuitry 80, (b) positions of large arrays within integrated circuitry 80, and (c) the actual number of terminal pads within integrated circuitry 80.

For example, FIG. 6 shows integrated circuitry 80 including terminal pad groups 10, 70, 72, 74 and 76 of FIG. 5. Integrated circuitry 80 further includes other terminal pad groups indicated in FIG. 6 by additional solid box enclosures, so that integrated circuitry 80 includes a total of twenty-eight terminal pad groups in this example.

This series of terminal pad groups operates to partition the terminal pads of integrated circuitry 80. Within each terminal pad group, the ground, Vdd and signal terminal pads are arranged to accommodate the deterministic connectivity technique of the illustrative embodiment. Accordingly, the deterministic connectivity technique of the illustrative embodiment is applicable to all terminal pad groups of integrated circuitry 80.

The technique of the illustrative embodiment is particularly advantageous where integrated circuitry 80 includes a single top level metal layer as discussed further hereinabove. This is because the technique of the illustrative embodiment supports the orderly routing of metal layers (which are formed by patterning the single top level metal layer). In this manner, such routing is less complex and more manageable.

Accordingly, the metal layers are more efficiently used. With the technique of the illustrative embodiment, additional signals (unrelated to signals of the IORDs) can be routed horizontally through and vertically through regions A–P of IORD group 52 (FIG. 4). This ability to route additional signals is not restricted to any particular level's metal layer(s).

Although an illustrative embodiment of the present inventions and their advantages have been described in detail hereinabove, they have been described as example and not as limitation. Various changes, substitutions and alterations can be made in the illustrative embodiment without departing from the breadth, scope and spirit of the present inventions. The breadth, scope and spirit of the present inventions should not be limited by the illustrative embodiment, but should be defined only in accordance with the following claims and equivalents thereof.

What is claimed is:

1. A method of connecting to integrated circuitry, comprising the steps of:

forming a connectivity cell, said connectivity cell including a plurality of terminals formed within the integrated circuitry, and including at least one metal layer connected to at least one of said terminals; and connecting a plurality of portions of the integrated circuitry to respective ones of said terminals such that said portions have a placement flexibility relative to said terminals at least equal to a placement flexibility of said portions within said connectivity cell.

2. The method of claim 1 wherein said connecting step comprises the step of connecting said portions to said terminals such that said portions have said placement flexibility independent of one another.

3. The method of claim 1 wherein said forming step comprises the step of forming said connectivity cell including an m×n array of terminals, where m and n are integers.

4. The method of claim 1 wherein said connecting step comprises the step of connecting said portions to said terminals such that said portions have a two-dimensional lateral placement flexibility relative to said terminals.

5. The method of claim 1 wherein said connecting step comprises the step of connecting said portions to respective ones of said terminals through each said metal layer.

6. The method of claim 1 and further comprising the step of patterning a single level metal layer to form each said metal layer.

7. The method of claim 1 and further comprising the step of connecting at least one of said terminals to a respective pin connector of a package in which the integrated circuitry is encapsulated.

8. A method of connecting to integrated circuitry, comprising the steps of:

forming first, second and third terminals within the integrated circuitry, such that said second terminal is positioned between said first and third terminals;

forming first, second and third metal layers by patterning a single level metal layer, such that said first metal layer is connected to at least said first terminal, said second metal layer is connected to at least said second terminal, and said third metal layer is connected to at least said third terminal; and forming a group of portions of the integrated circuitry, such that said group is positioned within an area delineated by said first and third terminals and includes at least first, second and third portions of the integrated circuitry, and such that, irrespective of an actual position of said group within said area, said first portion of the integrated circuitry is connected through said first metal layer to said first terminal, said second portion of the integrated circuitry is connected through said second metal layer to said second terminal, and said third portion of the integrated circuitry is connected through said third metal layer to said third terminal.

9. The method of claim 8 wherein said step of forming said group of portions comprises the step of forming said group of portions, such that said first portion is connected through said first metal layer to said first terminal, irrespective of an actual position of said first portion along a line segment parallel to a line between said first and third terminals.

10. The method of claim 9 wherein said line segment is between first and second points, is orthogonal to a line between said first point and said first terminal, and is orthogonal to a line between said second point and said third terminal.

11. The method of claim 8 wherein said step of forming said metal layers comprises the step of forming said metal layers, such that multiple ones of said metal layers are integral with one another, and such that multiple ones of said terminals are connected to one another through said integral metal layers.

12. The method of claim 8 wherein said area is a substantially rectangular area having first, second, third and fourth sides, said first and third sides are parallel to one another, said second and fourth sides are parallel to one another, and said area is delineated by said first terminal on said first side and by said third terminal on said third side.

13. The method of claim 12 and further comprising the step of forming fourth and fifth terminals within the integrated circuitry, such that said first, second and third terminals are positioned between said fourth and fifth terminals, and said area is delineated by said fourth terminal on said second side and by said fifth terminal on said fourth side.

* * * * *